(12) United States Patent
Hofmeister et al.

(10) Patent No.: US 7,437,078 B2
(45) Date of Patent: Oct. 14, 2008

(54) INTEGRATED POST-AMPLIFIER, LASER DRIVER, AND CONTROLLER

(75) Inventors: Ruldolf Hofmeister, Escondido, CA (US); Greta Light, San Mateo, CA (US); Gerald L. Dybsetter, Scotts Valley, CA (US)

(73) Assignee: Finisar Corporation, Sunnyvale, CA (US)

( * ) Notice: Subject to any disclaimer, the term of this patent is extended or adjusted under 35 U.S.C. 154(b) by 447 days.

(21) Appl. No.: 10/970,529

(22) Filed: Oct. 21, 2004

(65) Prior Publication Data

US 2005/0244163 A1 Nov. 3, 2005

Related U.S. Application Data

(60) Provisional application No. 60/550,585, filed on Mar. 5, 2004.

(51) Int. Cl.
*H04B 10/00* (2006.01)
(52) U.S. Cl. .................. 398/128; 398/135; 398/136; 398/138; 398/164
(58) Field of Classification Search .............. 398/128, 398/130, 135–138, 164; 372/38.02
See application file for complete search history.

(56) References Cited

U.S. PATENT DOCUMENTS

| | | | |
|---|---|---|---|
| 5,383,208 A | 1/1995 | Queniat et al. | |
| 6,512,617 B1 * | 1/2003 | Tanji et al. | 398/137 |
| 6,554,492 B2 * | 4/2003 | Gilliland et al. | 385/88 |
| 6,665,498 B1 | 12/2003 | Jiang et al. | |
| 6,836,493 B2 * | 12/2004 | Mahowald et al. | 372/38.01 |
| 6,862,302 B2 | 3/2005 | Chieng et al. | |
| 6,947,672 B2 * | 9/2005 | Jiang et al. | 398/135 |
| 7,131,859 B1 * | 11/2006 | Zumbrunnen et al. | 439/487 |
| 7,167,654 B2 * | 1/2007 | Tokita et al. | 398/138 |

FOREIGN PATENT DOCUMENTS

WO  WO 2004/013979 A2  2/2004

\* cited by examiner

*Primary Examiner*—Dalzid Singh
(74) *Attorney, Agent, or Firm*—Workman Nydegger

(57) ABSTRACT

A telecommunications system and constituent integrated circuit that includes a post-amplifier assembly configured for communication with an optical receiver, a laser driver assembly configured for communication with the optical transmitter, and a controller assembly configured to control the post-amplifier and laser driver. The post-amplifier, the laser driver, and the controller assemblies are embodied on a single integrated circuit, thereby reducing manufacturing costs. Noise due to clock generation may be reduced by having the clock act on a transient basis, turning on when needed during the boot process, and turning off when not needed during normal operation.

33 Claims, 8 Drawing Sheets

Fig. 5A

```
                              (TA)                                    (SLAV-STUS)
                               BH                         Z2           BT2 Z3   SP
           H   OP            BT1 DATA_H       Z1   DATA_L      CRC      ACK  E
     PRE   SR  DEV  ADDR     3 3 3     3 3 3   2 2 2     2 2 2   1 1 1   0 0 0 0 0 0
     6  5  4 4 4 4  4          3 3 2   3 2 1   4 3 2   2 2 2   5 4 3             1
     5  1 0 9 8 7 5  4 2 1     4 3 2 1 3 2 1   4 3 2   5 4 3   5 4 3   6 5 4 3 2 1 0
     |---|--|---|--|-------|--|-----|-------|-------|-------|-------|-----------|
RD:  H...H 1 00 100 VVV AAAAAAAA Z B DDDDDDDD 0 DDDDDDD 0 CCCCCCCC 0 1 0 0 1z  ←501B
moe: *   * ** *** ******** . *   ........ . *     ........ . *   . * . . . *
soe: .   . .. ... ........ . .   ........ . .     ........ . .   . . . . . .
     |---|--|---|--|-------|--|-----|-------|-------|-------|-------|-----------|
WR:  H...H 1 00 000 VVV AAAAAAAA 0 1 DDDDDDDD 0 DDDDDDD 0 CCCCCCCC Z 1 0 0 1z  ←504B
moe: *   * ** *** ******** * *   ******** * *     ******** * *   * * . . . *
soe: .   . .. ... ........ . *   ........ . .     ........ . .   . . . . . .
     |---|--|---|--|-------|--|-----|-------|-------|-------|-------|-----------|
crc_gen: . . .. ... ........ . .   ******** * *     ******** * *   . * . . . *
crc_chk: . . .. ... ******** * *   ******** * *     ******** * *   . * . . . *
         |---|--|---|--|-------|--|-----|-------|-------|-------|-------|-----------|
      <--|
         |___| (restart if input not all 1's)
      +---+

Fig. 5B
```

```
      H   OP   DEV  ADDR        BH            Z1   Z2
   PRE SR           BT1 DATA_H     DATA_L        SP
   5 3 33  333  33 2 222 2221  111 11 0 00
   3 9 87 6 532  320 9 210 9  210 0 3 210
   ------------------------------------------------
RD: H...H 1 00 110  VVV AAAAAAA Z  B DDDDDDD 0 1Z            ~501C
moe: . *  . . ***  ***********  .. *********** .*  :*.   :
soe: . *  . . ***  ***********  .. *********** .*  :*.   :
   ------------------------------------------------
WR: H...H 1 00 010  VVV AAAAAAA 0  1 DDDDDDD 0 1Z            ~504C
moe: . *  . . ***  ***********  .* *********** 0* :*.   :
soe: . *  . . ***  ***********  .. *********** .*  :*.   :
   ------------------------------------------------
      <  |  |  (restart if input not all 1's)
      |__|
      +---+
```

*Fig. 5C*

INTEGRATED POST-AMPLIFIER, LASER DRIVER, AND CONTROLLER

CROSS-REFERENCE TO RELATED APPLICATIONS

This application claims the benefit of U.S. Provisional Application No. 60/550,585 filed Mar. 5, 2004, which is incorporated herein by reference in its entirety.

BACKGROUND OF THE INVENTION

1. The Field of the Invention

The present invention relates generally to high speed transceivers. More particularly, embodiments of the present invention relate to systems and devices that integrate a post-amplifier, laser driver, and controller on the same integrated circuit, thereby resulting in reduced manufacturing costs as well as improvements in operational efficiency and functionality.

2. Background and Relevant Art

Many high speed data transmission networks rely on optical transceivers and similar devices for facilitating transmission and reception of digital data embodied in the form of optical signals. Typically, data transmission in such networks is implemented by way of an optical transmitter, such as a laser, while data reception is generally implemented by way of an optical receiver, an example of which is a photodiode.

Various other components are also employed by the optical transceiver to aid in the control of the optical transmit and receive components, as well as the processing of various data and other signals. For example, such optical transceivers typically include a driver (e.g., referred to as a "laser driver" when used to drive a laser signal) configured to control the operation of the optical transmitter in response to various control inputs. The optical transceiver also generally includes an amplifier (e.g., often referred to as a "post-amplifier") configured to perform various operations with respect to certain parameters of a data signal received by the optical receiver. A controller circuit (hereinafter referred to the "controller") controls the operation of the laser driver and post amplifier.

In conventional optical transceivers, the controller is implemented on a different integrated circuit ("IC") than the laser driver and post-amplifier. Accordingly, the collection of the controller, laser driver and post-amplifier are implemented as separate chips on a printed circuit board. The controller is electrically connected through the printed circuit board with the laser driver and post-amplifier.

One drawback to such an approach, however, is that the multiple separate ICs take up a relatively large amount of space on the printed circuit board. Furthermore, there is significant expense involved with separately manufacturing each IC. In the highly competitive marketplace for telecommunication equipment, it would be advantageous to more inexpensively manufacture a device that includes the controller, laser driver, and post-amplifier.

BRIEF SUMMARY OF THE INVENTION

The foregoing problems with the prior state of the art are overcome by the principles of the present invention. The principles of the present invention may be implemented in a telecommunications system and includes an integrated circuit that includes a post-amplifier assembly configured for communication with an optical receiver, a laser driver assembly configured for communication with the optical transmitter, and a controller assembly configured to control the post-amplifier and laser driver.

The post-amplifier, the laser driver, and the controller assemblies are embodied on a single integrated circuit, thereby reducing manufacturing costs. Noise due to clock generation may be reduced by having the clock act on a transient basis, turning on when needed during the boot process, and turning off when not needed during normal operation. This noise reduction is important when these various components are integrated onto the same chip in a high speed optical transceiver since the actual data channels are in close proximity to the clock and control circuitry.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIG. 5A illustrates an example frame in which the operation is to write or read using an extended field, and using Cyclic Redundancy Checking (CRC) and acknowledgements;

FIG. 5B illustrates an example frame in which the operation is to write or read without using an extended field, and using CRC and acknowledgements; and FIG. 5C illustrates an example frame in which the operation is to write or read without using an extended field, and without using CRC and acknowledgements.

DETAILED DESCRIPTION OF THE PREFERRED EMBODIMENTS

The principles of the present invention relate to a telecommunications system and constituent integrated circuit that includes a post-amplifier assembly configured for communication with an optical receiver, a laser driver assembly configured for communication with the optical transmitter, and a controller assembly configured to control the post-amplifier and laser driver. The post-amplifier, the laser driver, and the controller assemblies are embodied on a single integrated circuit, thereby reducing manufacturing costs. Reference will now be made to the drawings to describe various aspects of example embodiments of the invention. It is to be understood that the drawings are diagrammatic and schematic representations of only such example embodiments, and are not limiting of the present invention.

Figure 1:
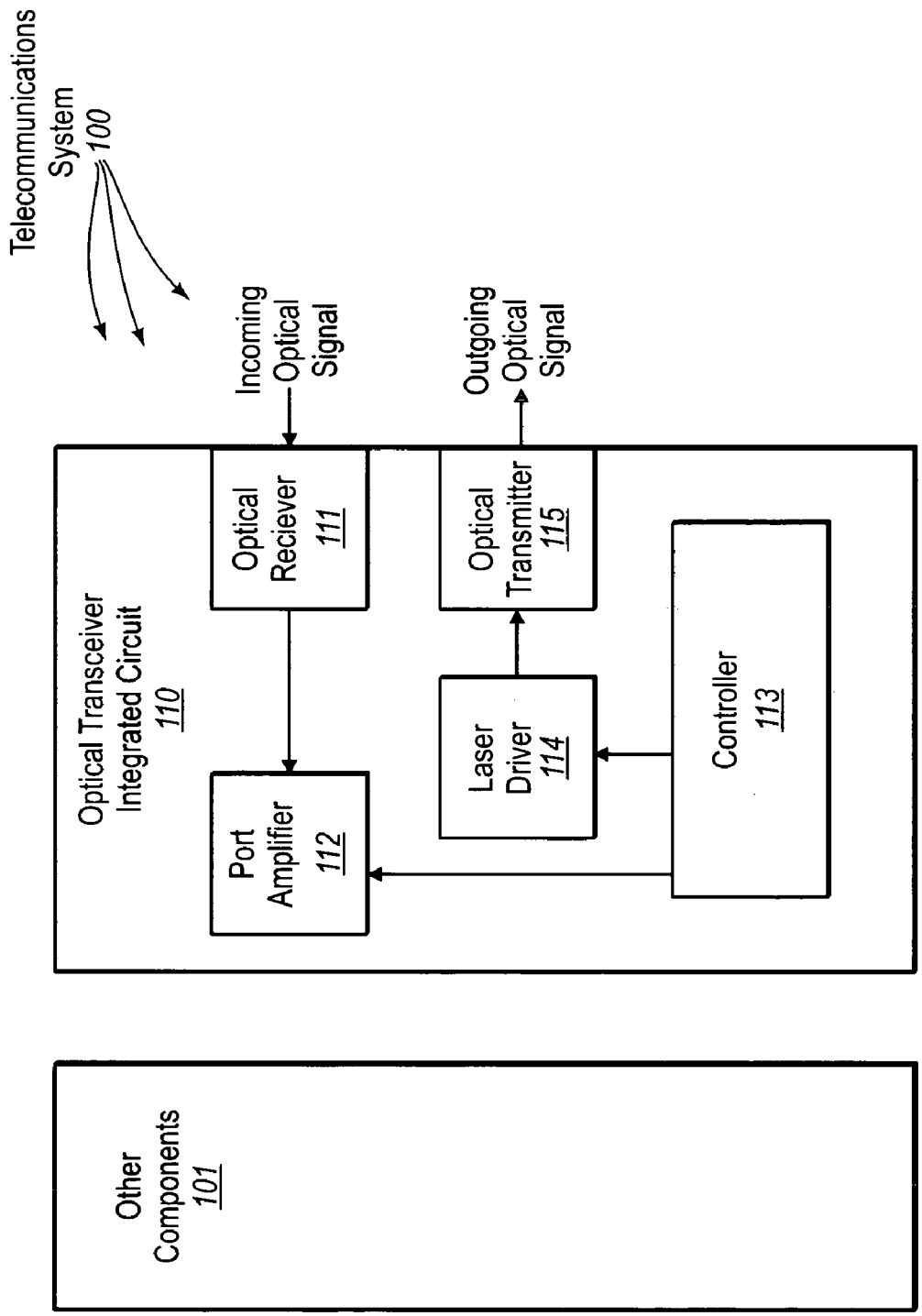
FIG. 1 schematically illustrates an optical transceiver integrated circuit embodied in a telecommunications system.

Turning to the drawings, FIG. 1 schematically illustrates a telecommunications system 100 that includes an optical transceiver integrated circuit 110 amongst potentially other components 101.

The optical transceiver integrated circuit 110 operates to receive an incoming optical signal and report the signal to the other components 101. Specifically, an optical receiver 111 receives the incoming optical signal and converts the optical signal into a corresponding electrical signal. The electrical signal is then provided to a post-amplifier 112 for appropriate amplification. The resulting electrical signal may then be used by, for example, a host computing system. The other components 101 may include the host computing system that uses the incoming signal.

The optical transceiver integrated circuit 110 also operates to transmit outgoing optical signals in response to instructions from a host computing system. A laser driver 114 properly interprets these instructions to provide an appropriate electrical signal to an optical transmitter 115. The optical transmitter 115 converts the electrical signal into an optical signal for transmission.

The post-amplifier 112 and the laser driver 114 are controlled by a controller 113, which configures the post-amplifier 112 and laser drivers 114 with appropriate settings. In some cases, the controller 113 may be sophisticated enough to dynamically adjust the settings for the post-amplifier 112 and laser driver 114 given changing operational circumstances.

The controller 113 may be integrated onto the same integrated circuit as the post-amplifier 112 and laser driver 114. In conventional systems, this would be impracticable since the conventional controllers typically use a consistent clock signal to time its operation. Such a clock signal generates noise, which can leak into the actual signal being received and transmitted. Integrating the controller onto the same chip as the post-amplifier and laser driver would increase this noise due to the elements being brought into closer proximity. However, the present invention reduces the impact of such clock-driven noise by only using the clock during certain clock-sensitive times in the controller operation. This makes it more feasible to integrate the controller 113 onto the same integrated circuit as the post-amplifier and laser driver 114. The optical receiver 111 and the optical transmitter 115 may also be integrated on the same integrated circuit, although this is not required. Integrating the controller 113, the post-amplifier 112, and the laser driver 114 onto the same circuit substantially reduces the manufacturing costs of the combination.

Figure 2A:
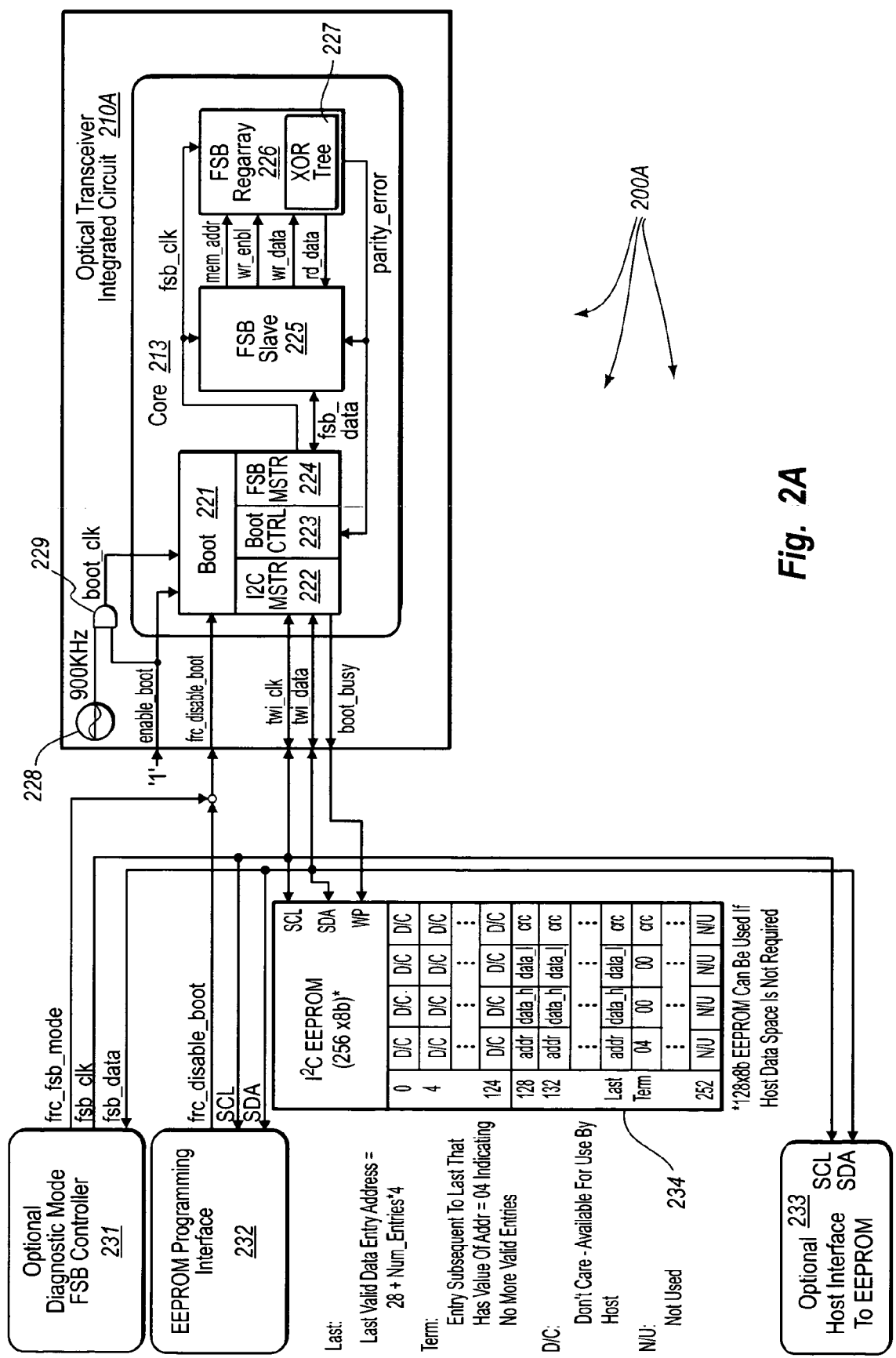
FIG. 2A schematically illustrates portions of the optical transceiver circuit in which the boot component controller is in boot mode in which the controller communicates with various components using two different two-wire interfaces.
Figure 2B:
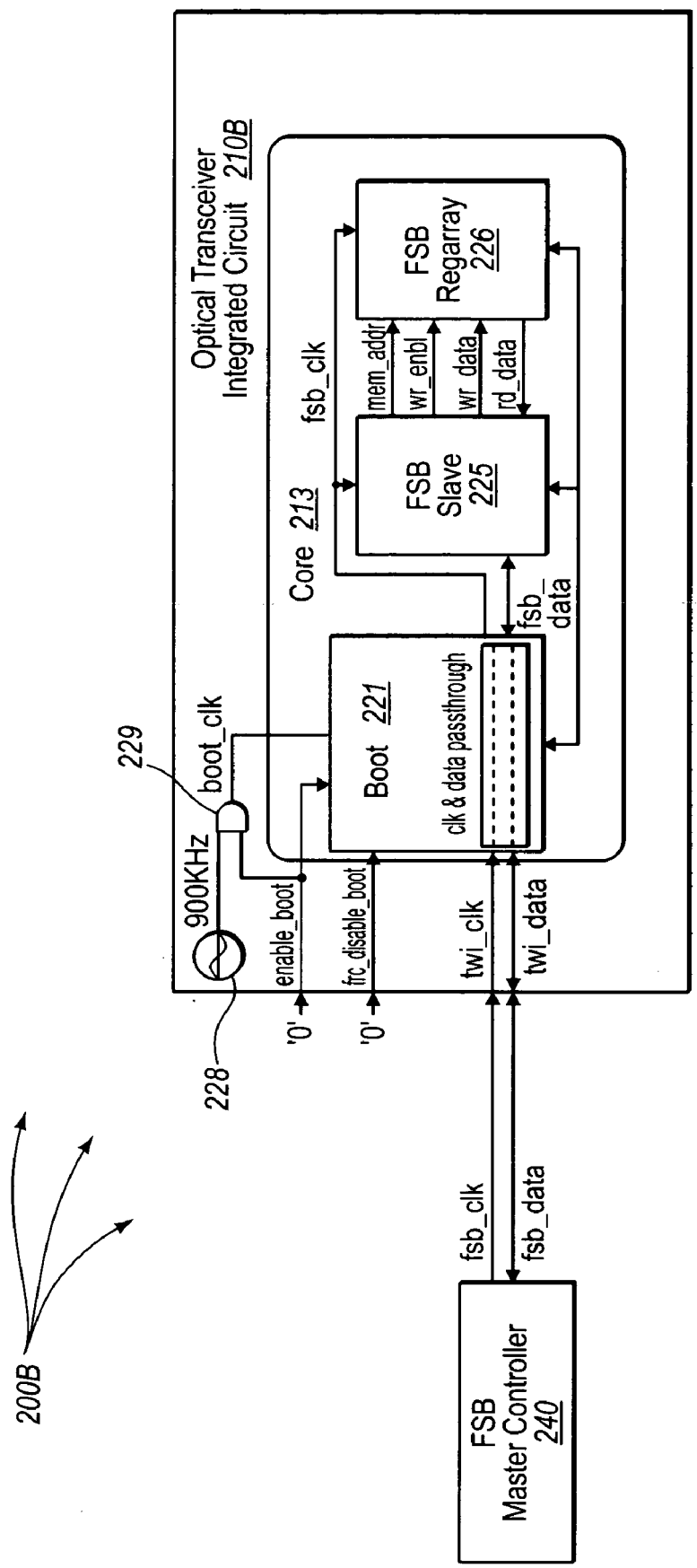
FIG. 2B schematically illustrates portions of the optical transceiver circuit in which the boot component is in passthrough mode in which the boot component permits communication to pass through between an external controller and the internal slave component.

FIGS. 2A and 2B schematically illustrate the optical transceiver integrated circuit that includes a digital core component 213. The digital core component 213 includes a boot component 221, an FSB slave component 225 and an FSB register array component 226. FSB stands for "Finisar Serial Bus" and is a Finisar-proprietary two-wire interface. More regarding this two-wire interface is described below with respect to FIGS. 4, 5A, 5B, and 5C. The slave component 225 and the register array 226 are labeled as FSB components because they may communicate using the FSB two-wire interface. However, the principles of the present invention are not limited to any specific manner of communication within the optical transceiver integrated circuit. The optical transceiver integrated circuit also may include a clock 228.

The post-amplifier 112 and laser driver 114 are not illustrated in FIGS. 2A and 2B although these components may be present within the optical transceiver integrated circuit as schematically illustrated in FIG. 1. However, settings for the post-amplifier 112 and the laser driver 114 may be memory mapped using the FSB register array component 226. The FSB slave component 225 reads data from and writes data to specified address locations within the FSB register array component 226 in response to specific FSB commands received from or through the boot component 221. Specifically, the FSB slave component 225 may generate signal mem_addr to address a location within the FSB register array 226, signal wr_enable to enable a write operation, and signal wr_data to specify the data to be written. In addition, the FSB slave component may read signal rd_data to read data from the specified memory address. The FSB register array 226 includes an XOR tree 227 which generates a parity_error signal if there is a parity error detected in the FSB register array. The structure and purpose of the XOR tree 227 will be described further below.

FIG. 2A illustrates a configuration 200A in which there is no controller external to the optical transceiver integrated circuit 210A. Instead, the on-chip boot component 221 serves as a controller. This configuration will be frequently referred to herein as the "internal controller configuration". In particular, the boot component 221 operates while the optical transceiver integrated circuit is starting up. During startup, the boot component 221 coordinates the proper loading of appropriate instructions from an external EEPROM 234 into the FSB register array 226. Once the startup process completes, the post-amplifier 112 and the laser driver 114 are then controlled based on the values within the FSB register array 226.

While booting in the internal controller configuration of FIG. 2A, the boot component 221 is active. This state is manifested to the boot component by the signal enable_boot being high. Even in this active state, the boot component 221 may be temporarily disabled by asserting the signal frc_disable_boot signal high.

During the boot process (during which time which the boot component 221 is active and not temporarily disabled), the boot component 221 communicates with the memory 234 using the conventional I²C two-wire interface. In particular, the boot control component 223 of the boot component 221 causes the I²C master component 222 of the boot component 221 to communicate with the EEPROM memory 234 using the I²C-compliant clock, data, and write protect signals. The clock signal is represented in FIG. 2A by signal SCL from the EEPROM perspective and signal twi_clk from the boot component perspective. The data signal is represented by signal SDA from the EEPROM perspective and signal twi_data from the boot component perspective. The write disable signal is represented by signal WP from the EEPROM perspective and by signal boot_busy from the boot component 221 perspective. The I²C two-wire interface and these corresponding signals are well-known to those of ordinary skill in the art.

Also during the boot process, the boot component 221 may communicate with and control the FSB slave component 225 using the FSB two-wire interface. In particular, the boot component 221 may use the boot control component 223 to control the FSB master component 224. In response, the FSB master component 224 provides an appropriate clock signal fsb_clk to the FSB slave component 225 and the FSB register array 226. Also, the FSB master component 224 provides a data signal fsb_data to the FSB slave component 225. The fsb_clk and fsb_data signals are provided in conformity with the FSB two-wire interface described below with respect to FIGS. 4, 5A, 5B and 5C.

The boot logic component 223 is configured such that when the boot component 221 is starting up, the appropriate data is loaded from the EEPROM 234 into the FSB register array 226. As previously mentioned, doing so involves communication with the EEPROM 234 using one two-wire interface while communicating with other components (e.g., the FSB slave component 225) using a different two-wire interface.

The internal controller configuration of FIG. 2A also illustrates several other external components. For instance, when optional diagnostic mode FSB controller 231 asserts signal frc_fsb_mode, the signal frc_disable_boot signal is likewise asserted, thereby disabling the boot controller 221. This allows the diagnostic mode FSB controller 231 to communicating straight through the boot component 221 and to the FSB slave component 225 using the FSB two-wire interface using clock signal fsb_clk and data signal fsb_data. In this configuration the diagnostic mode FSB controller 231 behaves as an FSB master component. Accordingly, the diagnostic mode FSB controller 231 may control the FSB slave component 225 to thereby cause appropriate diagnostics to be made on the FSB register array 226.

Also, the EEPROM programming interface 232 may likewise assert the frc_disable_boot signal to at least temporarily disable any boot operations. The EEPROM programming interface 232 may then communicate with the EEPROM 234 using the SCL and SDA signals in accordance with the conventional I²C two-wire interface. By disabling the boot process during the EEPROM programming, the risk of contention on the clock signal SCL and data signal SDA is significantly reduced. An optional host interface to EEPROM 233 may also be provided to allow a host computing system to interface with the EEPROM.

Accordingly, the internal controller configuration 200A of FIG. 2A provides a mechanism whereby the controller may be on the same integrated circuit as the post-amplifier and laser-driver. Accordingly, there is a higher risk of clock noise being injected into the received and transmitted signal due to the close proximity of the controller to the post-amplifier and laser driver. This risk is reduced by having the oscillator 228 only operate when the boot controller 221 is actively booting the optical transceiver integrated circuit 210A. The enable_boot is a static configuration signal which is active in the configuration shown in FIG. 2A. Accordingly, whatever signal is provided by the oscillator 228 is provided through the AND gate 229 in the form of clock signal boot_clk. The oscillator 228 is configured to provide such a clock signal during the boot process. Subsequent to the boot process, however, the oscillator 228 does not provide an oscillating clock signal, thereby eliminating clock noise caused by the oscillator 228.

Due to certain environmental conditions, it is conceivable that the data within the FSB register array 226 may become corrupted. This could have a harmful effect on the post-amplifier and laser driver since the physical operation of the post-amplifier and laser driver is directly dependent upon the values within the FSB register array 226. The optical transceiver integrated circuit 210A has a mechanism for recovering from register array corruption even without the clock being initially on.

Specifically, each byte in the register array 226 has a corresponding parity bit. For each byte, the XOR tree 227 includes an XOR sub-tree that logically XOR's each of the bits in the byte to generate an actual byte parity bit. The actual byte parity bit will be high if the number of logical one's in the byte is odd, and low if the number of logical one's in the byte is even, regardless of whether or not the byte is corrupted.

The actual byte parity bit is XOR'ed with an ideal byte parity bit stored for each byte. The ideal byte parity bit is high if the number of logical one's in the byte should be odd absent any corruption, and low if the number of logical one's in the byte should be even absent any corruption. For each byte, the actual byte parity bit is logically XOR'ed with the ideal byte parity bit to generate a byte parity error bit. The byte parity error bit will only be high if the corresponding byte has become corrupted. The various byte parity bits may be logically OR'ed (or XOR'ed) to generate the parity_error signal in FIG. 2A. Thus, the parity_error signal will only be high if the FSB register array has experienced corruption. In response to a high parity_error signal, the boot control component 223 asserts the en_boot_clk signal, which activates the oscillator 228 to thereby reinitiates the boot process. Rebooting should then initialize the register array to appropriate values to thereby allow normal operation to proceed. Once again, after the boot process, the boot clock may be shut off to reduce noise.

The boot controller 221 permits the internal controller configuration of FIG. 2A in which the controller, the post-amplifier, and the laser driver are all on the same optical transceiver integrated circuit. However, the boot controller 221 may also provide flexibility to have an external controller. FIG. 2B shows such a configuration 200B in which the FSB master controller 240 communicates directly through the boot component 221 to the FSB slave component 225 using clock signal fsb_clk and data signal fsb_data that conform to the FSB two-wire interface. In this case, the enable_boot signal is low thereby rendering the boot clock and the boot controller inactive. Furthermore, the frc_disable signal is low. The configuration of FIG. 2B may also be referred to herein as the "external controller configuration". The FSB master component 240 may operate to load, monitor, and update the FSB register array 226 via the FSB slave component 225.

The optical transceiver integrated circuit 210A of FIG. 2A may be physically structured identically to the optical transceiver integrated circuit 210B of FIG. 2B. The difference is in the value of the enable_boot signal and possibly the frc_disable_boot signal. Alternatively, the enable_boot signal may be the same in both FIGS. 2A and 2B, with the signal frc_disable_boot representing an override signal that enables the override configuration illustrated in FIG. 2B. Accordingly, the optical receiver integrated circuit 210 is flexible enough to accommodate both the internal controller configuration and the external controller configuration. Furthermore, this flexibility may be obtained by simply asserting appropriate configuration signals enable_boot and frc_disable_boot to the integrated circuit.

Figure 3:
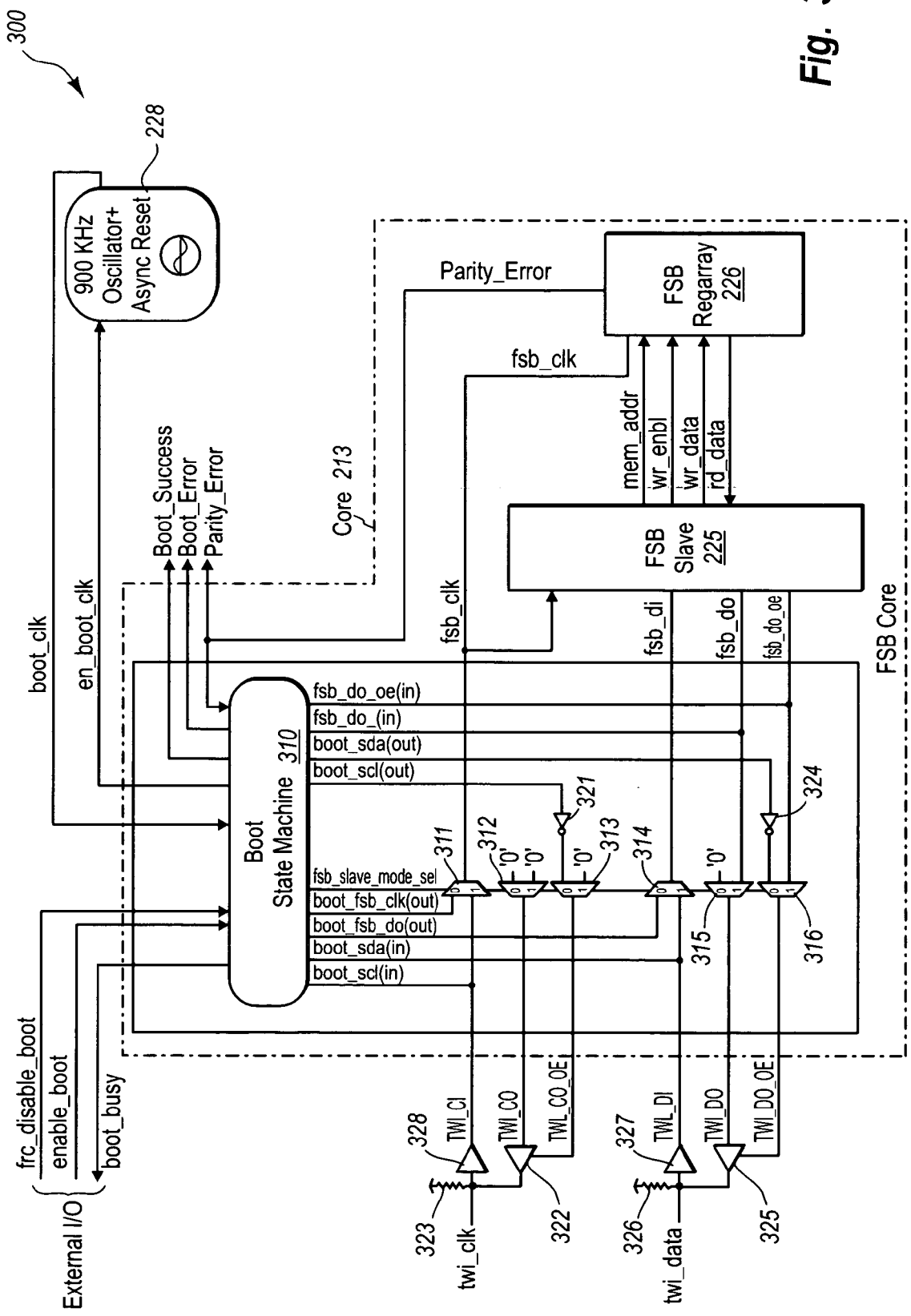
FIG. 3 illustrates a circuit diagram of the core of FIGS. 2A and 2B in further detail.

FIG. 3 illustrates a configuration 300 of the core component 213 in further detail. The I²C master component 222, the boot control component 223 and the FSB master component 224 are collectively illustrated in FIG. 3 as boot state machine 310. In the internal controller configuration, when the frc_disable_boot signal is low and the enable_boot signal is high, the boot state machine has access to the boot clock signal boot_clk. During the boot process, the boot state machine 310 operates as an FSB master component for the FSB slave component 225.

Specifically, the boot state machine 310 pulls signal fsb_slave_mode_sel low. This causes the upper input terminal (marked "0") of each of the multiplexers 311 through 316 to by coupled to its corresponding output terminal. The operation during this internal controller configuration will now be described in further detail with respect to FIG. 3.

The boot state machine 310 generates a clock signal boot_fsb_clk (out) that is derived from the boot clock signal boot_clk. This clock signal boot_fsb_clk (out) is then provided through the multiplexer 311 to become the FSB clock signal fsb_clk. The boot state machine 310 also may generate a data signal in accordance with the FSB two-wire interface and timed in accordance with the FSB clock signal. This data signal is represented by boot_fsb_do (out) passing through the multiplexer 314 to become signal fsb_di provided to the FSB slave component 225. The FSB slave component 225 may transmit data back to the state machine using signal fsb_do and using output enable signal fsb_do_oe. Accordingly, the boot state machine 310 is fully capable of acting as an FSB master component for the FSB slave component 225 using the configuration illustrated in FIG. 3.

During the boot process, the boot state machine 310 is also capable of communicating with the EEPROM using the I$^2$C two-wire interface. Specifically, a logical zero is asserted through the upper input terminal of the multiplexer 312 as signal TWI_CO. A clock signal boot_scl generated by the boot state machine 310 serves as the clock signal for the I$^2$C interface. If the clock signal boot_scl is high, the clock signal is inverted to low through inverter 321 to provide a low signal to the upper input terminal of multiplexer 313. This low signal is provided to driver 322 thereby isolating low signal TWI_CO from the output terminal of the driver 322. Accordingly, the signal twi_clk (the actual clock signal on the clock wire to the EEPROM) is permitted to pull high through pull-up resistor 323. If the clock signal boot_scl is low, the clock signal is inverted to high through inverter 321 to provide a high signal to the upper input of multiplexer 313. This high signal is provided to driver 322 thereby causing the driver to pass signal TWI_CO (which is low) as the clock signal twi_clk provided to the EEPROM. This emulates an open-drain driver. Accordingly, the I$^2$C clock signal twi_clk provided to the EEPROM follows the I$^2$C clock signal boot_scl generated by the boot state machine 310.

Similarly, from the I$^2$C data viewpoint, a logical zero is asserted through the upper input terminal of the multiplexer 315 as signal TWI_DO. A data signal boot_sda generated by the boot state machine 310 serves as the data signal generated by the boot component 221 for the I$^2$C interface with the EEPROM. If the data signal boot_sda is high, the data signal is inverted to low through inverter 324 to provide a low signal to the upper input of multiplexer 316. This low signal is provided to driver 325 thereby isolating low signal TWI_DO from the output terminal of the driver 325. Accordingly, the signal twi_data (the actual data signal on the data wire to the EEPROM) is permitted to pull high through pull-up resistor 326. If the data signal boot_sda is low, the data signal is inverted to high through inverter 324 to provide a high signal to the upper input of multiplexer 316. This high signal is provided to driver 325 thereby causing the driver to pass signal TWI_DO (which is low) as the data signal twi_data provided to the EEPROM. This emulates an open-drain driver while still maintaining the capability to directly drive the interface as desired. Accordingly, the I$^2$C data signal twi_data provided to the EEPROM follows the I$^2$C data signal boot_data generated by the boot state machine 310. In the other direction, the boot state machine 310 may also monitor data on the I$^2$C data wire. The signal twi_data is provided through the driver 327 as the I$^2$C data input signal boot_sda to the boot state machine 310.

In summary, during the boot process, the boot state machine 310 serves as an FSB master for the FSB slave component 225, and as an I$^2$C master for the external EEPROM. On the other hand, if the boot state machine 310 is not active (e.g., because the enable_boot signal is low, or because the frc_disable_boot signal is high), the data state machine permits off-chip components such as a controller to pass through communications through the boot component 221 directly to the FSB slave component 225. This serves the external controller configuration model of FIG. 2B.

In the external controller configuration mode, the boot state machine asserts the fsb_slave_mode_sel signal high. This couples the lower input terminal of the multiplexers 311 through 316 to their respective output terminals. Accordingly, the clock signal twi_clk generated by the off_chip controller passes directly through the driver 328 and through the multiplexer 311 to the FSB slave component 225 and FSB register array 226. The driver 322 is off and thus the boot state machine 310 does not communicate any clock signals.

The data signals twi_data generated by the external controller passes through the driver 327, through the multiplexer 314, and to the FSB slave component 225. If the FSB slave component 225 generates a high output enable signal fsb_do_eo, the driver 325 is on, and the data signal fsb_do generated by the FSB slave component 225 is provided through the multiplexer 315 and through the driver 325 to generate the data signal twi_data. Accordingly, in this configuration, the external controller communicates directly with the FSB slave component.

Accordingly, the principles of the present invention provide an optical transceiver integrated circuit in which the controller, the post-amplifier, and the laser driver may be integrated on the same chip with minimal noise impact. Furthermore, the optical transceiver integrated circuit is configurable either internally control the post-amplifier and laser driver, or allow an external controller to control the FSB slave component, without changing the physical structure of the optical transceiver integrated circuit. This allows users to have flexibility in choosing between a lower cost internal controller configuration, or a higher costs external controller configuration, based on the needs of the user.

It should be noted that while some embodiments of the invention are well-suited for use in conjunction with a high speed data transmission system conforming to the Gigabit Ethernet ("GigE") physical specification, such operating environment is exemplary only and embodiments of the invention may, more generally, be employed in any of a variety of high speed data transmission systems, some of which may have line rates up to, or exceeding, 1 G, 2.5 G, 4 G, 10 G and higher bandwidth fiber channels. For example, some embodiments of the invention are compatible with the Fibre Channel ("FC") physical specification.

Further, embodiments of the invention may be implemented in various ways. By way of example, some embodiments of the PA/LD are implemented in Small Form Factor Pluggable ("SFP") bi-directional transceiver modules. Such transceiver modules are configured for GigE and/or FC compliance. Exemplarily, such transceiver modules are capable of transmitting and/or receiving at a wavelength of about 850 nm. Moreover, these transceiver modules can operate over a wide range of temperatures. For example, some of such transceiver modules are effective over a temperature range of about 80° C., such as from about −10° C. to about +70° C. Of course, such embodiments and associated operating parameters are exemplary only, and are not intended to limit the scope of the invention in any way. For example, the principles of the present invention may be implemented in laser transmitter/receivers of any form factor such as XFP, SFP and SFF, without restriction.

Figure 4:
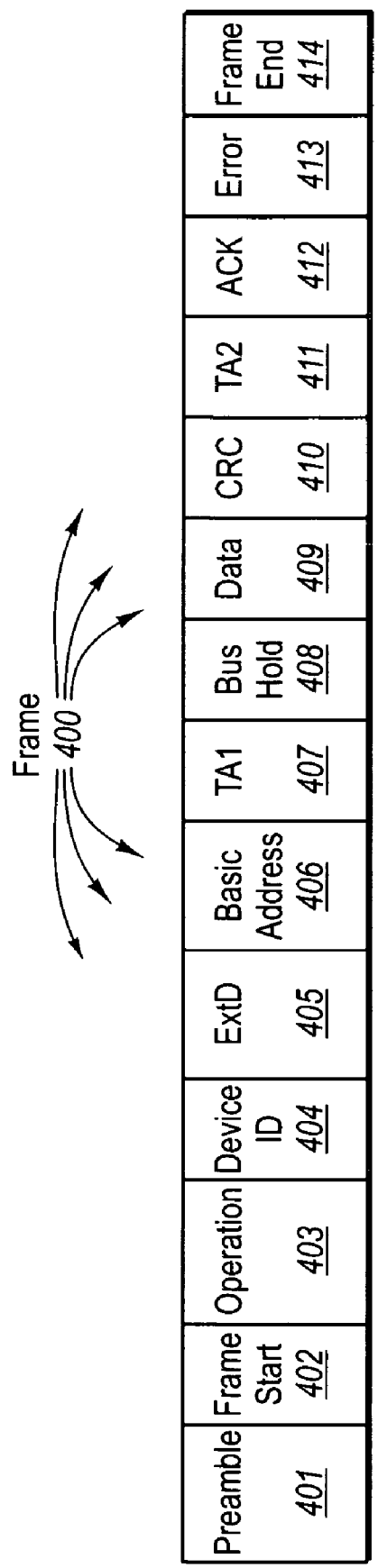
FIG. 4 schematically illustrates a sequential data structure of a frame that defines an FSB two-wire interface.

FIG. 4 illustrates a schematic diagram of a data structure 400 of a frame of an FSB two-wire interface mentioned briefly above with respect to FIGS. 2A, 2B and 3. The frame 400 includes a preamble field 401, a frame start field 402, an operation field 403, a device identifier field 404, an optional extended field 405, a basic address field 406, a first bus turnaround field 407, and optional bus hold field 408, a data field 409, an optional Cyclic Redundancy Checking (CRC) field 410, a second bus turnaround field 411, an optional acknowledgement field 412, an optional error status field 413, and a frame end field 414. As will be explained in further detail below, the frame 400 is designed so that within any component's turn for control of the data wire, there is a guaranteed zero interspersed more frequently than the length of the preamble.

The bus turnaround fields allow for optional transfer of data wire control between the FSB master component and the FSB slave component. Accordingly, the FSB master component may be providing some of the frame, while the FSB slave component may be providing other portions of the frame. Note that while a specific ordering of fields is shown in FIG. 4, there is considerable flexibility as to the ordering of the fields without adversely affecting the functionality of the frame 400 as will be apparent to those of ordinary skill in the art after having reviewed this description.

Figure 5A:
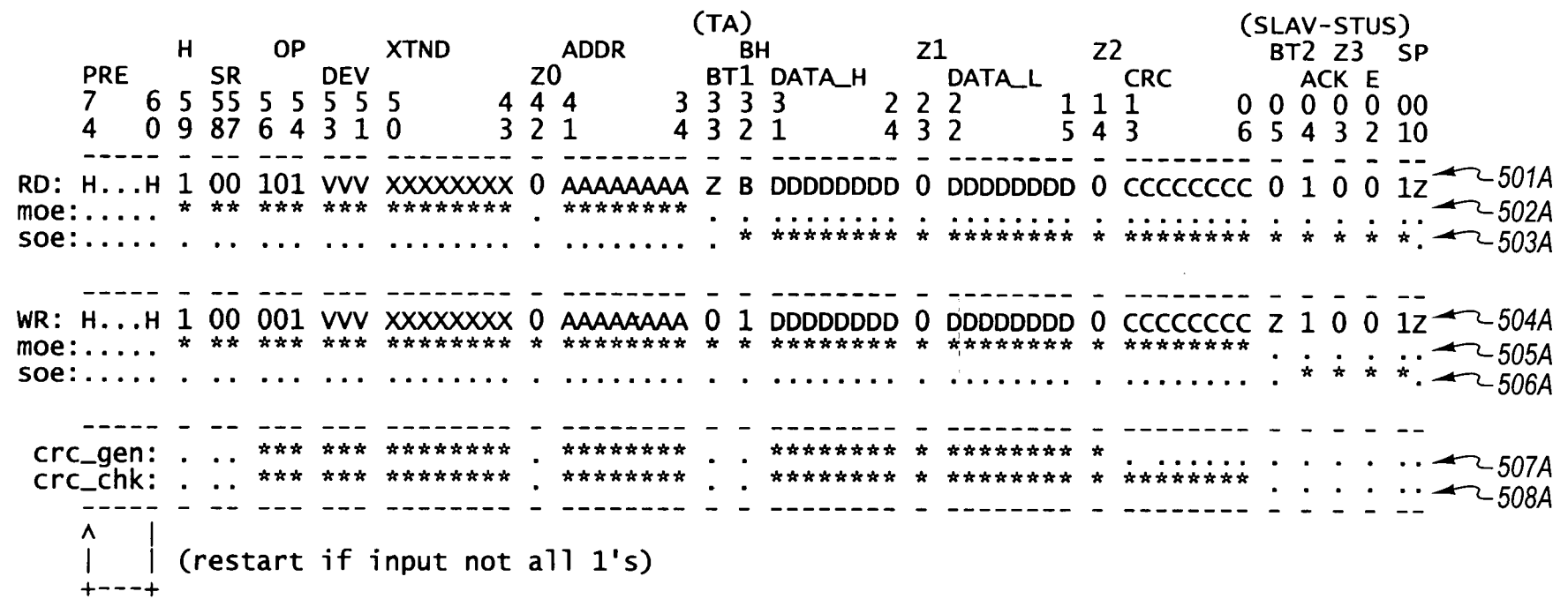

FIGS. 5A, 5B and 5C show specific embodiments of the frame 400. Some of the optional fields are included or excluded depending on the operation being performed. FIG. 5A illustrates an example frame in which the operation is to write or read using an extended field, and using Cyclic Redundancy Checking (CRC) and acknowledgements. FIG. 5B illustrates an example frame in which the operation is to write or read without using an extended field, and using CRC and acknowledgements. FIG. 5C illustrates an example frame in which the operation is to write or read without using an extended field, and without using CRC and acknowledgements.

Since FIG. 5A illustrates the most inclusive frame example, the various fields of the frame will be described in most detail with respect to FIG. 5A. The frame of FIG. 3A includes 75 bits corresponding to bits 74:0, regardless of whether the operation is a read operation as specified in line 501A or a write operation as specified in line 504A.

Line 502A illustrates an asterix at time increments when the FSB master component is in control of the data wire during a read operation, and otherwise contains a period. "MOE" at the beginning of the line stands for "Master data Output Enable". Line 303A illustrates an asterix at time increments when the FSB slave component is in control of the data wire during a read operation, and otherwise contains a period. "SOE" at the beginning of the line stands for "slave data Output Enable".

Similarly, line 505A illustrates an asterix at time increments when the FSB master component is in control of the data wire during a write operation, and otherwise contains a period. Furthermore, line 506A illustrates an asterix at time increments when the FSB slave component is in control of the data wire during a write operation, and otherwise contains a period. Lines 307A and 308A will be explained further below.

The frame begins with a preamble as represented in FIG. 5A by the 15 bits 74:60. This preamble is an example of the preamble field 401 of FIG. 4. The data wire 132 is left in a high impedance state. Absent any assertion on the data wire by FSB master component or any of the FSB slave component(s), the data wire is held to a logical one by a pull-up resistor (see resistor 326 of FIG. 3). When the FSB master component determines that a communication is to be made with FSB slave component, the FSB master component generates a clock signal on the clock wire. At the same time, each clock cycle, the FSB master component monitors the data wire for fifteen consecutive ones. The high impedance data wire does allow for proper assertion of data on the data wire despite the presence of the pull-up resistor.

If the FSB master component is not asserting anything on the data wire during the preamble phase, then the data wire should carry a logical one if none of the FSB slave components is transmitting the remainder of a prior frame on the data wire. Alternatively, even if the FSB master component may be asserting a logical one on the data wire during at least some of the preamble, then the data wire should still be carrying the logical one during the preamble phase assuming that none of the FSB slave components is transmitting on the data wire at that time. On the other hand, the frame is designed such that neither a FSB master nor a FSB slave transmits more than fifteen consecutive logical ones in a row when transmitting none-preamble portions of the frame.

Given the above, if the FSB master component detects a logical zero on the data wire while monitoring the data wire during the preamble phase of the frame, then a FSB slave component is likely communicating on the data wire. Whether or not logical zeros are detected, the FSB master component will wait until there are fifteen cycles of logical ones on the data wire before continuing with the frame. Due to the interspersed guaranteed zeros within the frame design, it is then that the FSB master component may safely transmit on the data wire with little risk that one of the FSB slave component(s) is also communicating on the data wire.

Accordingly, even if there is an error in synchronization between the FSB master component and the FSB slave component, synchronization is reacquired as the FSB master component waits for the FSB slave component to complete its use of the data wire before proceeding. The FSB slave component also monitors the data wire for fifteen consecutive ones. Accordingly, when the FSB slave component encounters fifteen consecutive ones, the FSB slave component awaits the rest of the frame. Accordingly, since the FSB slave component is not using the data wire at the time of the preamble regardless of whether the FSB slave component had previously lost synchronization with the FSB master component, the FSB slave component should be listening for the preamble at the preamble phase of the frame. Accordingly, the FSB slave component reacquires synchronization with the FSB master component.

Therefore, the preamble is significantly shortened while further retaining error recovery from loss of synchronization. Furthermore, since the data wire is biased high due to the pull-up resistor, the FSB master component need not assert any data on the data wire during the preamble phase, thereby reducing power requirements.

Once the preamble phase is completed (i.e., the FSB master component has detected at least fifteen consecutive binary ones on the data wire), the FSB master component asserts a logical one on the data wire as represented by bit 59. This turns on the output enable for the FSB master component, and maintains the data wire at the logical one for one more cycle.

The FSB master component then transmits two start of frame bits 58:57 which are guaranteed logical zeros. These start of frame bits are an example of the start of frame field 402 of FIG. 4. After the preamble phase is complete, the FSB slave component(s) are listening for these logical zeros. When they arrive, the FSB slave component(s) understand that the two logical zeros correspond to the start of the rest of the frame, thereby attaining synchronization. Two logical zeros are provided in order to provide sufficient statistical probability that the two logical zeros do indeed represent the start of a frame.

The FSB master component then transmits three operation code bits 56:54. These operation code bits are an example of the operation field 403 of FIG. 4. The three operation code bits would normally permit eight unique operations to be identified. However, in order to guarantee at least one logical zero in this operation code, the number of operations represented by the three bits is six, with the other two permutations of the operation code being reserved. In the illustrated example, bit sequences 011 and 111 are reserved.

In the example, operations bits 000 mean a write operation without using an extended field (explained further below), but with CRC checking and acknowledgements. A frame for this operation is shown in line 504B of FIG. 5B (see bits 47:45 of line 504B).

Operation bits 001 mean a write operation using an extended field, and with CRC checking and acknowledgments. A frame for this operation is shown in line 504A of FIG. 5A (see bits 56:54 of line 504A).

Operation bits 010 mean a write operation without using an extended field, and without CRC checking and acknowledgments. A frame for this operation is shown in line 504C of FIG. 5C (see bits 35:33 of line 504C).

Operations bits 100 mean a read operation without using an extended field, but with CRC checking and acknowledgements. A frame for this operation is shown in line 501B of FIG. 5B (see bits 47:45 of line 501B).

Operation bits 101 mean a read operation using an extended field, and with CRC checking and acknowledgments. A frame for this operation is shown in line 501A of FIG. 5A (see bits 56:54 of line 501A).

Operation bits 110 mean a read operation without using an extended field, and without CRC checking and acknowledgments. A frame for this operation is shown in line 501C of FIG. 5C (see bits 35:33 of line 501C).

Note how the structure of the frame differs depending on the operation. Accordingly, the FSB master component controls which frame structure is to be used by controlling the operation code. Upon reading the operation code, the FSB slave component is configured to expect the frame structure corresponding to the operation code. Accordingly, the FSB master component may dynamically adjust the frame structure as needed. In times when bandwidth is more of a concern, the shorter and less reliable frame structure (e.g., FIG. 5C) may be used. In times when reliability is more of a concern, the longer and more reliable frames structure (e.g., FIGS. 5A and 5B) may be used. When further bits are needed for any reason, the frame with the extended field (e.g., FIG. 5A) may be used. When these further bits are not needed, the frames without the extended field (e.g., FIGS. 5B and 5C) may be used.

Referring back to FIG. 5A, after the FSB master component transmits the operation code (i.e., bits 56:54), the FSB master component transmits a three bit device identifier corresponding to bits 53:51. These device identifier bits are an example of the device identifier field 404 of FIG. 4. The device identifier identifies which FSB slave component of the FSB slave component(s) that the FSB master component is to communicate with. Since three bits are used for the device identifier in this embodiment, there may be up to eight FSB slave components in this embodiment (or seven FSB slave components if the FSB master component is to also have an address for self-diagnostic purposes).

Until the time that the device identifier bits are provided, each of the FSB slave component(s) was monitoring the communications over the data wire. However, upon receiving the device identifier bits, the FSB slave component may identify itself as corresponding to the device identifier. The other FSB slave components, if any, may ignore the rest of the frame. Even though the other FSB slave components ignore the rest of the frame, the other FSB slave components may immediately continue monitoring the data wire for another preamble indicative of another frame being transmitted. Alternatively, the other FSB slave component may initiate such monitoring after clock signals are once again asserted on the clock wire indicating that the next frame is about to begin.

After the FSB master component asserts the device identifier bits 53:51 on the data wire, the FSB master component asserts eight bits 50:43 that correspond to an extended field. These extended bits are an example of the extended field 405 of FIG. 4. In the case of FIG. 5A, the operation code causes the FSB slave component to expect these extended bits. The FSB master component then transmits a guaranteed logical zero as bit 42 thereby ensuring that fifteen consecutive logical ones on the data wire means that a frame is in the preamble phase to thereby support the above-described synchronization recovery mechanism.

The extended field may include any extended bits that are useful so long as the meaning of the bits is commonly recognized by both communicating components. For example, some or all of the extended field may represent an extended address for use when communicating with FSB slave components having larger address spaces. Alternatively or in addition, some or all of the extended field may represent an extended operation code where further operation types are desired.

The FSB master component then asserts eight bits 41:34 that correspond to the basic address. These eight bits 41:34 are an example of the basic address field 406 of FIG. 4. If all of the extended field represents an extended address, the FSB slave component may use all of the sixteen bits 50:43 and 41:34 to properly identify the address space that applies to the operation.

The next bit 33 in the frame is a first turnaround bit and represents an example of the first turnaround field 407 of FIG. 4. The turnaround bits are somewhat unique in that they allow for optional exchange of control of the data wire between the FSB master component and the FSB slave component.

In the case of a write operation, the first turnaround bit 33 is a logical zero, indicating that control is to stay for the time being with the FSB master component. Accordingly, referring to line 505A of FIG. 5A, the FSB master component retains control of the data wire through the turnaround bit 33; and referring to line 506A of FIG. 5A, the FSB slave component does not gain control of the data wire through the turnaround bit 33. This retaining of control is appropriate since the FSB master component is the one that is providing that data that is the subject of a write operation initiated by the FSB master component.

On the other hand, in the case of a read operation, the first turnaround bit 33 is a high-z, meaning that the data wire is permitted to float at its high impedance state in which none of the FSB master component or FSB slave component is actively asserting bits on the data wire. This represents that control of the data wire has passed to the FSB slave component (see lines 502A and 503A of FIG. 5A). This transfer of control is appropriate since the FSB slave component is the one that is providing that data that is the subject of a read operation initiated by the FSB master component.

In the case of a read operation, the FSB slave component then has the opportunity to pause the frame in cases in which the FSB slave component is not ready to continue at this stage. The FSB slave component asserts the bus hold bit 32 to a logical zero if it is not ready to continue. When ready to continue, the FSB slave component asserts a logical one if it is ready to proceed thereby given the FSB master component notice that the FSB slave component is ready to continue. This provides the FSB slave component with an option to pause the frame when the FSB slave component is not ready to continue for the time being. An additional pausing option available to the FSB slave component is described below with respect to the acknowledgement bit. In the case of a write operation, the bus hold bit 32 is a guaranteed logical one. The bus hold bit 32 is an example of the bus hold field 408 of FIG. 4.

In the case of a read operation, after the FSB slave component transmits the bit hold bit 32, the FSB slave component transmits the eight most significant bits followed by a guaranteed zero bit. In the case of a write operation, after the FSB master component transmits the bit hold bit 32, the FSB master component transmits the eight most significant bits followed by the guaranteed zero bit. In either case, the eight most significant bits are represented by bits 31:24, and the following guaranteed zero bit is represented by bit 23.

In the case of a read operation, after the FSB slave component transmits the guaranteed zero bit 23, the FSB slave component transmits the eight least significant bits followed by another guaranteed zero bit. In the case of a write operation, after the FSB master component transmits the guaranteed zero bit 23, the FSB master component transmits the eight least significant bits followed by the other guaranteed zero bit. In either case, the eight least significant bits are represented by bits 22:15, while the other guaranteed zero bit is represented by bit 14. The combination of the data bits 31:24 and 22:15 are an example of the data field 409 of FIG. 4.

In the case of a read operation, after the FSB slave component transmits the guaranteed zero bit 14, the FSB slave component transmits eight bits of Cyclic Redundancy Checking (CRC) data corresponding to bits 13:06. The CRC bits are one example of the CRC field 410 of FIG. 4. Using all the bits after the start of frame bits 58:57 and prior to the CRC bits 13:06, both the FSB master component and the FSB slave component calculate CRC data as shown in line 507A. When the FSB master component receives the CRC bits 13:06 back from the FSB slave component, the FSB master component then compares the CRC information generated by both the FSB master component and the FSB slave component as represented by line 508A. If there is a mismatch, then there has likely been an error in transmission, and the FSB master component may begin the frame again after the current frame is ended.

In the case of a write operation, after the FSB master component transmits the guaranteed zero bit 14, the FSB master component transmits the CRC bits 13:06. Once again, both the FSB master component and the FSB slave component calculate their CRC data. When the FSB slave component receives the CRC bits 13:06 from the FSB master component, the FSB slave component then compares the CRC information generated by both the FSB master component and the FSB slave component. If there is a mismatch, then there has likely been an error in transmission, and the FSB master component may begin the frame again after the current frame is ended after the FSB master component has been notified of the error. In some cases, an erroneous write operation may have catastrophic (or at least harmful) effects. For example, if the erroneous write operation was for setting a laser bias current, the laser strength could be too strong such that signal distortion occurs. Accordingly, reliable communications is important in such circumstances. The FSB slave component may elect to suppress a write operation when such an error is detected.

After the CRC bits 13:06, there is a second turnaround bit 05. This second turnaround bit is an example of the second turnaround field 411 of FIG. 4. This turnaround operation allows control of the data wire to be given to the FSB slave component if control is not there already. This allows the FSB slave component to give reliability information back to the FSB master component.

In the case of a read operation, control of the data wire has already been passed to the FSB slave component using the first turnaround bit. Accordingly, this second turnaround bit is a logical zero indicating no change in control of the data wire. On the other hand, in the case of a write operation, control of the data wire was not previously given to the FSB slave component using the first turnaround bit. Accordingly, the data wire is allowed to float at its high impedance state indicating a transfer of control of the data wire to the FSB slave component. Accordingly, after the second turnaround bit 05, the FSB slave component has control of the data wire regardless of whether the operation is a read operation or a write operation.

After the second turnaround bit 05, the FSB slave component asserts an acknowledgment bit 04, which is an example of the acknowledgement field 412 of FIG. 4. This acknowledgement bit may represent whether or not the operation was successful. In this case, a logical one means successful completion of the operation. Had the FSB slave component been too busy to respond to the FSB master component, the FSB slave component may assert a logical zero for the acknowledgement bit 04, thereby forcing the FSB master component to reinitiate the frame. Accordingly, the acknowledgment bit 03, and the bit hold bit 32 provide a way for the FSB slave component to address the situation where it cannot respond to the request.

The FSB slave component then asserts a guaranteed zero bit 03, followed by an error bit 02, which is an example of the error field 413 of FIG. 4. The error field may indicate whether or not there was an error in CRC checking and/or a violation of the protocol (e.g., a logical one is detected where a logical zero should occur). In the case of a read operation, the FSB master component will already be in possession of CRC data sufficient to make this determination. However, in the case of a write operation, the FSB slave component is the one that made the comparison of CRC data. Accordingly, it is at this time that the FSB slave component notifies the FSB master component of any mismatch in CRC data. A mismatch would result in the FSB master component reinitiating the frame. The presence of CRC and acknowledgment information in the frame allows for more reliable communication between the FSB master component and the FSB slave component(s).

The FSB slave component then asserts two end of frame bits 01:00, which indicates the end of the frame. The first bit 01 is a logical one, which forces the data bus immediately to a logical one. In the second bit, the data bus is allowed to float at its high impedance state, ready for the next frame to begin. If the first bit 01 were a logical zero, it may take some time for the pull-up resistor to pull the data wire up to a voltage level that could be interpreted as a logical one. Accordingly, the setting of the first bit 01 at a logical one means that the next frame may begin sooner, thereby improving performance.

FIG. 5B illustrates an example frame in which the operation is to write or read without using an extended field, and using CRC and acknowledgements. The frame of FIG. 5B is similar to that described above with respect to FIG. 5A, except that the operation is to write or read without using the extended field. Accordingly, bits 50:42 of FIG. 5A are absent from FIG. 5B and the bits are renumbered accordingly.

FIG. 5C illustrates an example frame in which the operation is to write or read without using an extended field, and without using CRC and acknowledgements. The frame of FIG. 5C is similar to that described above with respect to FIG. 5A, except that the operation is to write or read without using the extended field. Accordingly, bits 50:42 of FIG. 5A are absent from FIG. 5B. Furthermore, there is no reliability information within the frame. Hence, bits 13:02 of FIG. 5A are absence from FIG. 5C. The absence from FIG. 5C of bits that are present in FIG. 5A warrants the renumber of the remaining bits in FIG. 5C.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. An optical transceiver integrated circuit that comprises the following:
   a post-amplifier assembly configured for communication with an optical receiver;
   a first two-wire interface;
   a second two-wire interface that is different from the first two-wire interface;
   a register array;
   a persistent memory;
   a laser driver assembly configured for communication with an optical transmitter; and
   a controller assembly configured to control the post-amplifier and laser driver, the controller assembly further being configured to communicate with the register array by way of the first two wire interface and to communicate with the persistent memory by way of the second two-wire interface, and the post-amplifier, the laser driver, and the controller assemblies being implemented together on a single integrated circuit.

2. An optical transceiver integrated circuit in accordance with claim 1, further comprising the optical receiver, wherein the optical receiver is also implemented on the single integrated circuit.

3. An optical transceiver integrated circuit in accordance with claim 2, further comprising the optical transmitter, wherein the optical transmitter is also implemented on the single integrated circuit.

4. An optical transceiver integrated circuit in accordance with claim 1, further comprising the optical transmitter, wherein the optical transmitter is also implemented on the single integrated circuit.

5. An optical transceiver integrated circuit in accordance with claim 1, wherein the optical transceiver integrated circuit is a 1 G laser transceiver.

6. An optical transceiver integrated circuit in accordance with claim 1, wherein the optical transceiver integrated circuit is a 2.5 G laser transceiver.

7. An optical transceiver integrated circuit in accordance with claim 1, wherein the optical transceiver integrated circuit is a 4 G laser transceiver.

8. An optical transceiver integrated circuit in accordance with claim 1, wherein the optical transceiver integrated circuit is a 10 G laser transceiver.

9. An optical transceiver integrated circuit in accordance with claim 1, wherein the optical transceiver integrated circuit is a laser transceiver suitable for fiber channels greater than 10G.

10. An optical transceiver integrated circuit in accordance with claim 1, wherein the optical transceiver integrated circuit is an XFP laser transceiver.

11. An optical transceiver integrated circuit in accordance with claim 1, wherein the optical transceiver integrated circuit is an SFP laser transceiver.

12. An optical transceiver integrated circuit in accordance with claim 1, wherein the optical transceiver integrated circuit is an SFF laser transceiver.

13. An optical transceiver integrated circuit in accordance with claim 1, further comprising a register array, the laser driver and post-amplifier being controlled by values within the register array, wherein the controller is configured to control the laser driver and post-amplifier by writing values to the register array.

14. An optical transceiver integrated circuit in accordance with claim 1, wherein the controller is configured to communicate with the register array using the first two-wire interface in response to content within the persistent memory, wherein the second two-wire interface is used to read the content from the persistent memory.

15. An optical transceiver integrated circuit in accordance with claim 1, further comprising a diagnostic module configured to selectively disable the controller communicating using the second two-wire interface with the persistent memory, and further configured to diagnose content of the persistent memory using the second two-wire interface once the controller is so disabled.

16. An optical transceiver integrated circuit in accordance with claim 1, further comprising a diagnostic module configured to selectively disable the controller communicating using the first two-wire interface with the register array, and further configured to diagnose content of the register array using the first two-wire interface once the controller is so disabled.

17. An optical transceiver integrated circuit in accordance with claim 1, wherein the controller is configured to be selectively enter pass through mode in which signals to and from the persistent memory are passed from and to the register array.

18. An optical transceiver integrated circuit in accordance with claim 1, wherein the second two-wire interface is $I^2C$, and the first two-wire interface is a two-wire interface that is different than $I^2C$.

19. A telecommunications system comprising an optical transceiver integrated circuit that comprises the following:
   a first two-wire interface;
   a second two-wire interface that is different from the first two-wire interface;
   a persistent memory;
   a register array;
   a post-amplifier assembly configured for communication with an optical receiver;
   a laser driver assembly configured for communication with the optical transmitter;
   a controller assembly configured to control the post-amplifier and laser driver and the controller assembly further being configured to communicate with the register array by way of the first two-wire interface, wherein the post-amplifier, the laser driver, and the controller assemblies are embodied on a single integrated circuit; and a diagnostic module, wherein the diagnostic module is:
configured to selectively disable controller communications using the second two-wire interface with the persistent memory, and further configured to diagnose content of the persistent memory using the second two-wire interface once the controller is so disabled; and/or
configured to selectively disable controller communications using the first two-wire interface with the register array, and further configured to diagnose content of the register array using the first two-wire interface once the controller is so disabled.

20. A telecommunications system in accordance with claim 19, wherein the optical transceiver integrated circuit further comprises the optical receiver, wherein the optical receiver is also embodied on the single integrated circuit.

21. A telecommunications system in accordance with claim 20, wherein the optical transceiver integrated circuit further comprises the optical transmitter, wherein the optical transmitter is also embodiment on the single integrated circuit.

22. A telecommunications system in accordance with claim 19, wherein the optical transceiver integrated circuit further comprises the optical transmitter, wherein the optical transmitter is also embodiment on the single integrated circuit.

23. A telecommunications system in accordance with claim 19, wherein the optical transceiver integrated circuit is one of: a 1 G laser transceiver; a 2.5 G laser transceiver; a 4G laser transceiver; a 10 G laser transceiver; or, a laser transceiver compatible with data rates greater than 10 Gbps.

24. A telecommunications system in accordance with claim 19, wherein the optical transceiver integrated circuit is one of: an XFP laser transceiver; an SFP laser transceiver; or, an SFF laser transceiver.

25. A telecommunications system in accordance with claim 19, wherein the optical transceiver integrated circuit further comprises a register array, the laser driver and post-amplifier being controlled by values within the register array, wherein the controller is configured to control the laser driver and post-amplifier by writing values to the register array.

26. A telecommunications system in accordance with claim 19, wherein the controller is configured to communicate with the register array using the first two-wire interface in response to content within the persistent memory, wherein the second two-wire interface is used to read the content from the persistent memory.

27. A telecommunications system in accordance with claim 19, wherein the controller is configured to be selectively enter pass through mode in which signals to and from the persistent memory are passed from and to the register array.

28. A telecommunications system in accordance with claim 19, wherein the second two-wire interface is $I^2C$, and the first two-wire interface is a two-wire interface that is different than $I^2C$.

29. An optical transceiver integrated circuit, comprising
an optical receiver;
an optical transmitter;
a post-amplifier assembly configured for communication with the optical receiver;
a laser driver assembly configured for communication with the optical transmitter;
a boot component that serves as a controller for the post-amplifier and laser driver assemblies, the boot component, laser driver assembly and post-amplifier assembly being implemented together on a single integrated circuit; and
a clock configured for communication with the boot component, the clock further being configured to operate only while the boot component is active.

30. The optical transceiver integrated circuit as recited in claim 29, wherein the boot component remains active while a 'high' boot enable signal is asserted.

31. The optical transceiver integrated circuit as recited in claim 29, further comprising an AND gate that includes:
a first input connected to the clock;
a second input connected to a boot enable signal line; and
an output connected to the boot component.

32. The optical transceiver integrated circuit as recited in claim 31, wherein when a boot enable signal at the second input of the AND gate is 'high,' a clock signal is provided to the boot component from the output of the AND gate.

33. The optical transceiver integrated circuit as recited in claim 29, wherein the boot component is an element of a digital core component that further comprises a slave component and a register array component that are configured to communicate with each other, and the slave component and register array component further being configured for communication with the boot component.

* * * * *

UNITED STATES PATENT AND TRADEMARK OFFICE
CERTIFICATE OF CORRECTION

| | | |
|---|---|---|
| PATENT NO. | : 7,437,078 B2 | Page 1 of 1 |
| APPLICATION NO. | : 10/970529 | |
| DATED | : October 14, 2008 | |
| INVENTOR(S) | : Hofmeister et al. | |

It is certified that error appears in the above-identified patent and that said Letters Patent is hereby corrected as shown below:

<u>Col. 6</u>
Line 22, change "reinitiates" to --reinitiate--

<u>Col. 8</u>
Line 38, change "either" to --to either--
Line 43, change "costs" to --cost--

<u>Col. 9</u>
Line 45, change "3A" to --5A--
Line 53, change "303A" to --503A--
Line 64, change "307A" to --507A-- and "308A" to --508A--

<u>Col. 13</u>
Line 9, change "given" to --giving--

<u>Col. 14</u>
Line 4, change "too" to --so--

Signed and Sealed this

Seventh Day of September, 2010

David J. Kappos
*Director of the United States Patent and Trademark Office*